(12) United States Patent
Goldberg (10) Patent No.: US 7,610,570 B1
(45) Date of Patent: Oct. 27, 2009

(54) METHOD AND MECHANISM FOR USING SYSTEMATIC LOCAL SEARCH FOR SAT SOLVING

(75) Inventor: Evgueni Goldberg, El Cerrito, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/407,864

(22) Filed: Apr. 19, 2006

(51) Int. Cl.
*G06F 17/50* (2006.01)

(52) U.S. Cl. .................................. 716/5; 716/3; 716/4

(58) Field of Classification Search .................. 716/3–5
See application file for complete search history.

(56) References Cited

U.S. PATENT DOCUMENTS 6,247,164 B1   6/2001   Ashar et al.

OTHER PUBLICATIONS

J. Hao, L. Tétart, "CH-SAT: A Complete Heuristic Procedure for Satisfiability Problems", ECAI-96 Workshop on Advances in Propositional Deduction, Aug. 1996.*
E. Goldberg, Y. Novikov, "Berkmin: A fast and robust SAT-solver", Proceedings of the Design, Automation, and Test in Europe Conference and Exhibition, Mar. 2002, pp. 142-149.*
Baptista, L. et al.; "*The Interplay of Randomization and Learning of Real-World Instances of Satisfiability*"; Proceedings of the AAAI Workshop on Leveraging Probability and Uncertainty in Computation; Jul. 2000.
Bayardo, R. et al.; "*Using CSP Look-Back Techniques to Solve Real-World SAT Instances*"; Proceedings of the Fourteenth National Conference on Artifical Intelligence and Ninth Innovative Applications of Artifical Intelligence Conference; 1997; pp. 203-208; American Association for Artifical Intelligence Press; USA.
Ben-Sasson, E. et al.; "*Near-Optimal Separation of Treelike and General Resolution*"; Electronic Colloquium on Computational Complexity, Report No. 5; Third Workshop on the Satisfiabiility Problem—May 2000; Jan. 17, 2000; pp. 14-18; ECCC; Israel.
Biere, A., et al.; "*Symbolic Model Checking Using SAT Procedures Instead of BDDs*"; Proceedings of Design Automation Conference—DAC'99; 1999; pp. 317-320; ACM; USA.
Brayton, R.K., et al.; "*Logic Minimization Algorithms for VLSI Synthesis*"; Kluwer Academic Publishers, 1984; USA.
Burch, J. R., et al.; "*Tight Integration of Combination Verification Methods*"; Proceedings of the International Conference on Computer-Aided Design; 1998; pp. 570-576; ACM, USA.
Davis, M., et al.; "*A Machine Program for Theorem-Proving*"; Communications of the ACM; 1962; pp. 394-397; USA.
Dubois, O., et al.; "*SAT versus UNSAT*"; Second DIMACS Series in Discrete Mathematics and Theoretical Computer Science; 1996; pp. 415-436; vol. 26; American Mathematical Society.

(Continued)

*Primary Examiner*—Jack Chiang
*Assistant Examiner*—Aric Lin
(74) *Attorney, Agent, or Firm*—Vista IP Law Group, LLP.

(57) ABSTRACT

An improved method and mechanism for designing and verifying an electrical circuit design is provided using an improved SAT-solver which uses complete assignments and systematic local search to provides improved performance. In one approach, the sat-solver maintains a complete assignment that is changed one variable at a time. A variable is fixed within the falsified set of clauses.

50 Claims, 5 Drawing Sheets

OTHER PUBLICATIONS

Freeman, J.W.; "*Improvements to Propositional Satisfiability Search Algorithms*"; A Dissertation in Computer and Information Science, University of Pennsylvania, 1995; 1995; USA.

Goldberg, E. et al.; "*Using SAT for Combinational Equivalence Checking*"; Proceedings of the Design Automation and Test in Europe Conference—2001; 2001; pp. 114-121; IEEE; USA.

Gomes, C. P., et al.; "*Boosting Combinatorial Search Through Randomization*"; Proceedings of the International Conference on Principles and Practice of Constraint Programming; 1998; pp. 431-437; American Association for Artificial Intelligence Press/ The MIT Press; USA.

Gomes; C. P., et al.; "*Heavy-Tailed Distributions in Combinatorial Search*"; Principles and Practice of Constraint Programming—CP97; 1997; pp. 121-135; Springer.

Li, C. M.; "*A Constraint-Based Approach to Narrow Search Trees for Satisfiability*"; Information Processing Letters 71; 1999; pp. 75-80; vol. 71; Elsevier Science B.V.; France.

Marques-Silva, J.; "*The Impact of Branching Heuristics in Propositional Satisfiability Algorithms*"; Proceedings of the 9th Portuguese Conference on Artificial Intelligence (EPIA); Sep. 1999; LNAI; pp. 62-74; 1695; Portugal.

Marques-Silva, J. P. et al.; "*GRASP: A New Search Algorithm for Satisfiability*"; CSE-TR-292-96; Apr. 10, 1996; pp. 1-17; The University of Michigan; USA.

Marques-Silva, J. P. et al.; "*GRASP: A Search Algorithm for Propositional Satisfiability*"; IEEE Transactions on Computers; May 1999; pp. 506-521; vol. 48; No. 5.

Moskewicz, M. W. et al.; "*Chaff: Engineering an Efficient SAT Solver*"; Proceedings of the 38th Design Automation Conference -DAC '01; 2001; pp. 530-535; ACM; USA.

Novikov, Y. A.; "*Using Restarts When Solving SAT-Instances*"; Proceedings of the Fourth International Conference on Computer-Aided Design of Discrete Devices CAD DD '01; 2001; pp. 166-174; vol. 3; National Academy of Sciences of Belarus Institute of Engineering Cybernetics; Republic of Belarus.

Stephan, P., et al.; "*Combinational Test Generation Using Satisfiability*"; IEEE Transactions on Computer-Aided Design of Integrated Circuits and Systems; Sep. 1996; pp. 1167-1176; vol. 15; No. 9; IEEE; USA.

Velev, M. N.; Curriculum Vitae; 2004; http://www.ece.cmu.edu/~mvelev.

Zhang, H.; "*SATO; An Efficient Propositional Prover*"; Proceedings of the 14th International Conference on Automated Deduction—CADE- 14; Jul. 1997; pp. 272-275; Springer; Australia.

www.satlib.org/benchm.html; SATLIB—Benchmark Problems; 2004.

www.lri.fr/~simon/satex/satex.php3; The SAT-Ex site; 2004.

Fang, H. et al.; "*Complete Local Search for Propositional Satisfiability*"; Proceedings of 19th National Conference on Artificial Intelligence; 2004; pp. 161-166.

Goldberg, E.; "*Testing Satisfiability of CNF Formulas by Computing a Stable Set of Points*"; Annals of Mathematics and Artificial Intelligence (2005) 43: 65-89; Springer 2004.

Selman, B. et al.; "*Noise Strategies for Improving Local Search*"; AAAI; 1994; pp. 337-343; Seattle.

Habet, D. et al.; "*A Hybrid Approach for SAT*"; International Conference on Principles and Practice of Constraint Porgramming; 2002; pp. 172-184.

Mazure, B. et al.; "*Boosting Complete Techniques Thanks to Local Search Methods*"; Annals of Math. and Artif. Intelligence; 1998; pp. 319-331; vol. 22.

Prestvvich, S.; "*Local Search and Backtracking vs. Non-Systematic Backtracking*"; AAAI Fall Symposium on Using Uncertainty Within Computation; Nov. 2-4, 2001; pp. 109-115; North Falmouth, Cape Cod, MA.

\* cited by examiner

```
New_Sat_Solver (F)
{p=generate_initial_point (F);
M=find_falsified_clauses (F, p);
while (true)
{if (BCP(F,M,p) == conflict)
{C = generate_conflict_clause( F);
if ( ( C == empty) return(UNSAT);
else  backtrack (F,p,M);
}
else // no conflict yet
if ( M == empty) return (SAT);
else fix_variable_value (F, p, M);
}
}
```

$C_1 = w + b + m$ $C_2 = \sim w + d + e$

The resolvent of $C_1$, $C_2$ is $b + m + d + e + \ldots$ $p_1 = (w=0, b=0, d=0, e=0, \ldots\ldots\ldots)$ $p_2 = (w=1, b=0, d=0, e=0, \ldots\ldots\ldots)$ $p_1$ falsifies $C_1$ $p_2$ falsifies $C_2$

METHOD AND MECHANISM FOR USING SYSTEMATIC LOCAL SEARCH FOR SAT SOLVING

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to technology for designing and verifying electronic circuit designs, and in particular, is directed to a method and system for solving satisfiability problems related to the design and verification of electronic circuits.

An IC is a small electronic device typically formed from semiconductor material. Each IC contains a large number of electronic components that are wired together to create a self-contained circuit device. A single IC may include millions of individual devices, such as transistors, capacitors, and resistors, formed on a chip to perform desired functions.

Production of complex ICs is an intricate process that involves many steps. One of the first steps in producing an IC involves designing a virtual version of the IC using computer-aided design tools. The design of a virtual version of an IC can be broken down into three general areas: design definition, design verification, and design layout. IC design definition can be described at various levels of sophistication or detail. The levels of design sophistication include the functional level, also referred to as the register transfer level (RTL) or the architectural level; the logical level, also referred to as the gate level; and the transistor level, also referred to as the layout level.

Numerous approaches can be taken to perform design verification. Functional verification is an approach that verifies the functionality and operation of a circuit design. Two well known approaches to performing functional verification are circuit simulation and formal verification.

Electronic design automation (EDA) tools are often used to design and verify electronic circuits. EDA tools generally comprise software applications, often CAD-based, which include algorithms that specifically address various steps of the IC design process. Specialized EDA tools may be used for the functions of circuit design, layout, place and route, verification, test generation, and simulation.

Boolean satisfiability techniques have found numerous applications in EDA tools. The satisfiability (SAT) problem consists of determining a satisfying variable assignment, V, for a function (or formula), $f$, or determining that no such V exists. The function $f$ may be expressed in conjunctive normal form (CNF), which consists of the logical AND (i.e., conjunction) of one or more clauses. Each clause consists of the logical OR (i.e., disjunction) of one or more literals. A literal is a Boolean function of one argument or variable. Each variable x has a positive literal, i.e., the identity function of x, denoted as x, and a negative literal, i.e., the negation function of x, denoted as ~x.

SAT-solvers refer to a class of tools or algorithms that can be used to solve SAT and/or implement SAT-based solutions with respect to Boolean equations or formulas, and have particular applications for addressing problems faced by many EDA tools. For example, SAT-solvers have been used to facilitate automatic test generation, simulation, synthesis, and verification tools.

Existing SAT-solvers can essentially be classified into two groups. A first group of SAT-solvers uses the systematic search algorithm (SSA). The first SSA for solving SAT (usually referred to as the DPLL procedure) was introduced in early 1960s in M. Davis, G. Longemann, D. Loveland, "A Machine program for theorem proving," Communications of the ACM, 1962, Vol. 5, pp. 394-397. Since then, SSA-type SAT-solvers have undergone numerous changes. Modern SSAs use restarts, in which the SAT-solver occasionally abandons the current search tree and start building a new one, e.g., as described in C. P. Gomes, B. Selman, H. Kautz, "Boosting combinational search through randomization," Proceedings of International Conference on Principles and Practice of Constraint Programming, 1997. Clause recording is used to avoid visiting solution free parts of the search space, e.g., as described in J. P. M. Silva, K. A. Sakallah, "GRASP: A Search Algorithm for Propositional Satisfiability," IEEE Transactions of Computers, 1999, Vol. 48, pp. 506-521. State-of-the-art SSAs also use fast Boolean Constraint Propagation (BCP) procedure, as described in H. Zhang, "SATO: An efficient propositional prover," Proceedings of the International Conference on Automated Deduction, July 1997, pp. 272-275 and M. W. Moskewicz, C. F. Madigan, Y. Zhao, L. Zhang, S. Malik, "Chaff: Engineering an Efficient SAT Solver", Proceedings of the 38$^{th}$ Design Automation Conference (DAC '01), 2001. Conventional SSAs also use decision making procedures that allow one to reduce the number of backtracks, as described in M. W. Moskewicz, C. F. Madigan, Y. Zhao, L. Zhang, S. Malik, "Chaff: Engineering an Efficient SAT Solver," Proceeding of the 38$^{th}$ Design Automation Conference (DAC '01), 2001 and E. Goldberg, Y. Novikov, "Berk-Min: a Fast and Robust SAT-Solver," DATE-2002, pp. 142-149, 2002. One more feature of modern SSAs is the use of a set of heuristics for discarding "useless" clauses.

The second group of SAT-solvers uses local search algorithms (LSAs), such as the one described in B. Selman, H. A. Kautz. and B. Cohen, "Noise strategies for improving local search," AAAI-94, pp. 337-343, 1994. LSA-based SAT-solvers usually operate on a complete assignment trying to minimize the number of clauses falsified by this assignment. Such algorithms can find a satisfying assignment for a satisfiable formula but can not prove formula's unsatisfiability.

A few attempts were made to combine features of LSAs and SSAs. The potential of random backtracking were explored in S. Prestwich, "Local search and backtracking vs. non-systematic backtracking," AAAI Fall Symposium on Using Uncertainty Within Computation. Nov. 2-4, 2001, pp. 109-115. A "mechanical" combination of LSA and SSA was studied in B. Mazure, L. Sais, and R. Gregoire, "Boosting complete techniques thanks to local search methods," Annals of Math. and Artif. Intelligence, vol. 22 (1998), pp. 319-331, in which at each node of a search tree, a LSA was launched. This approach was further developed in D. Habet, C. M. Li, L. Devendeville, and M. Vasquez, "A hybrid approach for SAT," International Conference on Principles and Practice of Constraint Programming, 2002, pp. 172-184. Adding new clauses to throw the algorithm away from local minima was studied in H. Fang, W. Ruml, "Complete Local Search for Propositional Satisfiability," Proc. of 19$^{th}$ National Conference on Artificial Intelligence, 2004, pp. 161-166.

However, all state-of-the-art SAT-solvers are based on the concept of a partial assignment (partial solution). The premise of all such SAT-solvers is that to prove a formula to be unsatisfiable one needs to enumerate (either explicitly or implicitly) all possible complete assignments. By rejecting one partial assignment, a SAT-solver generally rejects an exponential number of infeasible solutions.

Since many problems in synthesis, automatic test pattern generation (ATPG), verification, artificial intelligence, cryptology, and other fields reduce to SAT problems, it is desirable to discover new methods and systems for solving SAT problems efficiently.

SUMMARY

The present invention is directed to an improved SAT-solver which uses complete assignments and systematic local search to provide improved performance and to serve as a basis for new generation of SAT-solvers. In one embodiment, the sat-solver maintains a complete assignment that is changed one variable at a time. The embodiment fixes a variable within the falsified set of clauses. Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present invention is directed to an improved SAT-solver which uses complete assignments and systematic local search to provide improved performance and serve a basis for a new generation of resolution-based SAT-solvers. The improved SAT-solver can be applied to tools and software in a number of technical fields, such as synthesis, automatic test pattern generation (ATPG), verification, artificial intelligence, and cryptology. In particular, the improved SAT-solver may be used within EDA tools to design and verify integrated circuit designs.

As noted above, conventional SAT-solvers are all based on the concept of a partial assignment (partial solution). The reason for using partial rather than complete assignments is that by rejecting a partial assignment the DPLL procedure may "simultaneously" reject an exponential number of complete assignments. The premise of such an approach is that to prove that a CNF formula F is unsatisfiable one has to show that F evaluates to 0 for all complete assignments.

According to some embodiments of the invention, an improved SAT-solver can be implemented which uses complete assignments and systematic local search. In some embodiments, this is based upon the principle that one can prove the unsatisfiability of a formula without visiting all the points of the formula. In particular, the minimum number of points that need to be visited to prove that a CNF formula F is unsatisfiable can not be larger than the size of a resolution proof (measured in the number of resolution operations) that F is unsatisfiable. The latter fact shows that a resolution based SAT-solver can be successfully built on the basis of an algorithm operating on complete rather than partial assignments.

Simulation Image of a Resolution Proof

A SAT-solver according to some embodiments of the invention is inspired by the notion of a simulation image of a resolution proof. A resolution proof that a formula F is unsatisfiable is a sequence of resolution operations that result in deriving an empty clause. Suppose clauses $C_1$ and $C_2$ that have opposite literals of a variable w and there is only one such variable of $C_1$ and $C_2$. The resolution operation derives a clause C from clauses $C_1$ and $C_2$ that is implied by $C_1 \wedge C_2$. This clause C is called the resolvent of $C_1$ and $C_2$. The clause C consists of all the literals of $C_1$ and $C_2$ except the literals of variable w.

Suppose that clause C is the resolvent of clauses $C_1$ and $C_2$. Suppose $p_1$ and $p_2$ are complete assignment such that $C_1(p_1)=C_2(p_2)=0$ and $p_1$ and $p_2$ are different only in the value of the variable w. The, points $p_1$ and $p_2$ are referred to herein as a simulation image of the resolution operation over clauses $C_1$ and $C_2$.

Suppose that R is a resolution proof that a formula F is unsatisfiable, and that K is a set of points such that for each resolution operation of R, there are two points of K that are a simulation image of this operation. In this situation, the set K can be referred to as a simulation image of the resolution proof R.

A simulation image of a resolution proof R can be viewed as an "encoding" of R. On the one hand, the size of a minimum size simulation image cannot be larger that twice the size of a minimum size resolution proof (e.g., as measured in the number of resolution operations). On the other hand, to prove that a formula is unsatisfiable it is sufficient for a resolution based SAT-solver operating on complete assignment to visit only points forming a simulation image of a resolution proof. This implies that a SAT-solver operating on complete assignments can be very successful.

Pseudocode a) Sat-Solver without Restarts

Figure 1:
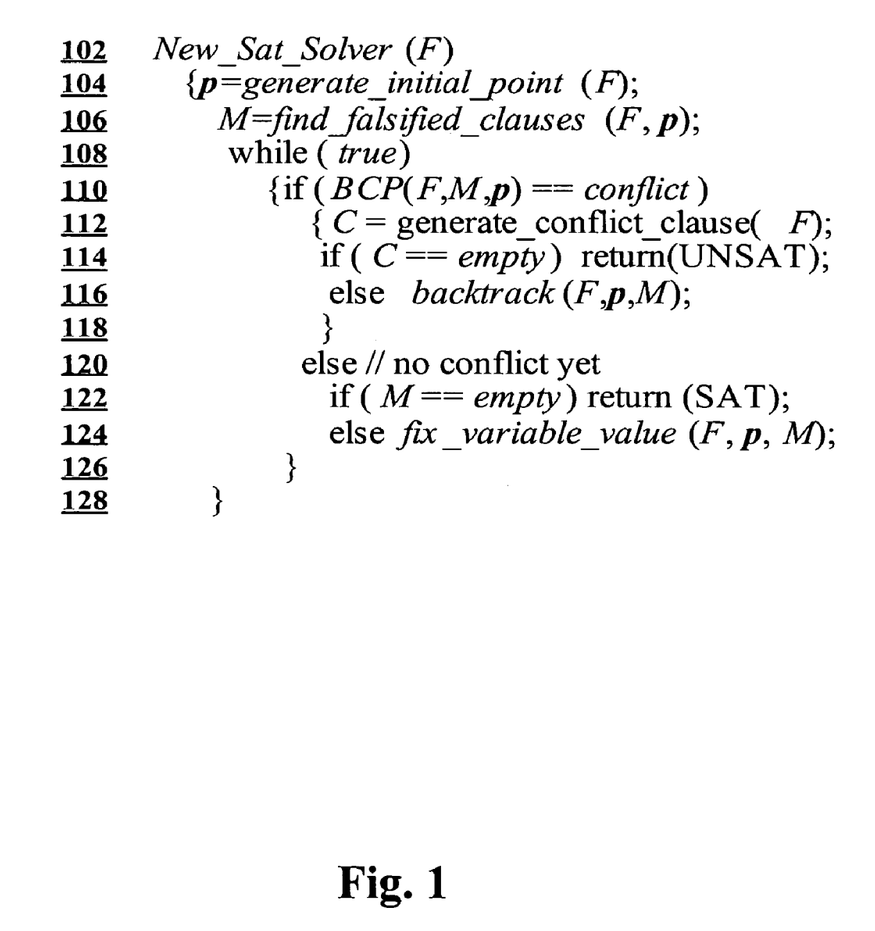
FIG. 1 shows pseudocode of one embodiment of a new SAT-solver with no restarts.

The pseudo-code of one embodiment of the inventive SAT-solver is shown in FIG. 1. The inventive SAT-solver operates on complete assignments and so, in contrast to DPLL-like procedures, does not have free variables. At any step of the SAT-solver, every variable of the formula is assigned. The initial assignment of variables is performed in line 104 by generating an initial complete assignments. For purposes of this illustrative explanation, a complete assignment will be also referred to as a point. The Sat-solver then computes the set M(p) of clauses falsified by p in line 106. Instead of making an assignment to a free variable $x_i$, the SAT-solver fixes the value of $x_i$ in the current point p. This fixing means that in all the points p visited later, the value of $x_i$ stays the same until the time that it is "unfixed". The Sat-solver unfixes $x_i$ by unassigning $x_i$ (e.g., as in a DPLL-like procedure) and making it free again.

The main computation occurs in the loop from lines 108 to 126. First, the SAT-solver runs a standard Boolean Constrained Propagation (BCP) procedure. If all literals of a clause C of the current formula but one are set to 0 by a fixed assignment, then there is only one way to satisfy C. This kind of forced assignments is performed by the BCP procedure in line 110.

The BCP procedure may result in a conflict. A conflict is the situation when the set of clauses M(p) falsified by the current point contains a clause C of the current formula such that all the assignments setting the literals of C to 0 have been fixed. In this situation, no point satisfying C can be obtained from p without unfixing one of the assignments that has been fixed before. If a conflict occurs, the new SAT-solver generates so-called conflict clause, e.g., as described in J. P. M. Silva, K. A. Sakallah, "GRASP: A Search Algorithm for Propositional Satisfiability," IEEE Transactions of Computers, 1999, Vol. 48, pp. 506-521 and M. W. Moskewicz, C. F. Madigan, Y. Zhao, L. Zhang, S. Malik, "Chaff: Engineering an Efficient SAT Solver," Proceeding of the 38$^{th}$ Design Automation Conference (DAC '01), 2001. If this conflict clause is empty, then the formula is unsatisfiable, and the process returns at line 114. Otherwise, the SAT-solver backtracks to the last relevant fixed variable $x_i$ and unfixes it and all the assignments that have been fixed after $x_i$ (line 116). The current point p does not change during backtracking.

If no conflict occurred during BCP, the SAT-solver checks the set M(p) of clauses falsified by the current complete assignments. If this set is empty, then the formula is satisfiable, and the process returns 'satisfiable' at line 122. If M(p) is not empty, the SAT-solver fixes a value of a variable, i.e., makes a "decision" in line 124.

This highlights an important feature of the SAT-solver, since the decision-making is "local". That is, only a variable of a clause from M(p), i.e. a clause falsified by p, is fixed. The variables of clauses of M(p) are usually a very small subset of the entire set of variables.

If the BCP procedure or the decision-making procedure fixes a value of a variable x and the current point p has the same value of x, then p and the set M(p) do not change. However, if one of these procedures fixes an assignment to x that does not agree with the value of x in p, then p changes by flipping the value of x and the set M(p) of clauses falsified by the new current point is computed, e.g., by recomputing M(p) of the previous point.

b) New Sat-Solver with Restarts

An embodiment of the new SAT-solver may make restarts. As used herein, the term "restart" refers to the action of abandoning a current search tree and starting a new one. When an assignment is fixed, it restricts the choices for the SAT-solver. The idea of a restart is to make the choices open again. For example, in a previous iteration, one or more variables may be fixed. In subsequent iteration(s), other things may be changed, e.g., fixing other variable(s), different ordering, etc. An iteration is the run of the SAT-solver between two consecutive restarts.

Figure 2:
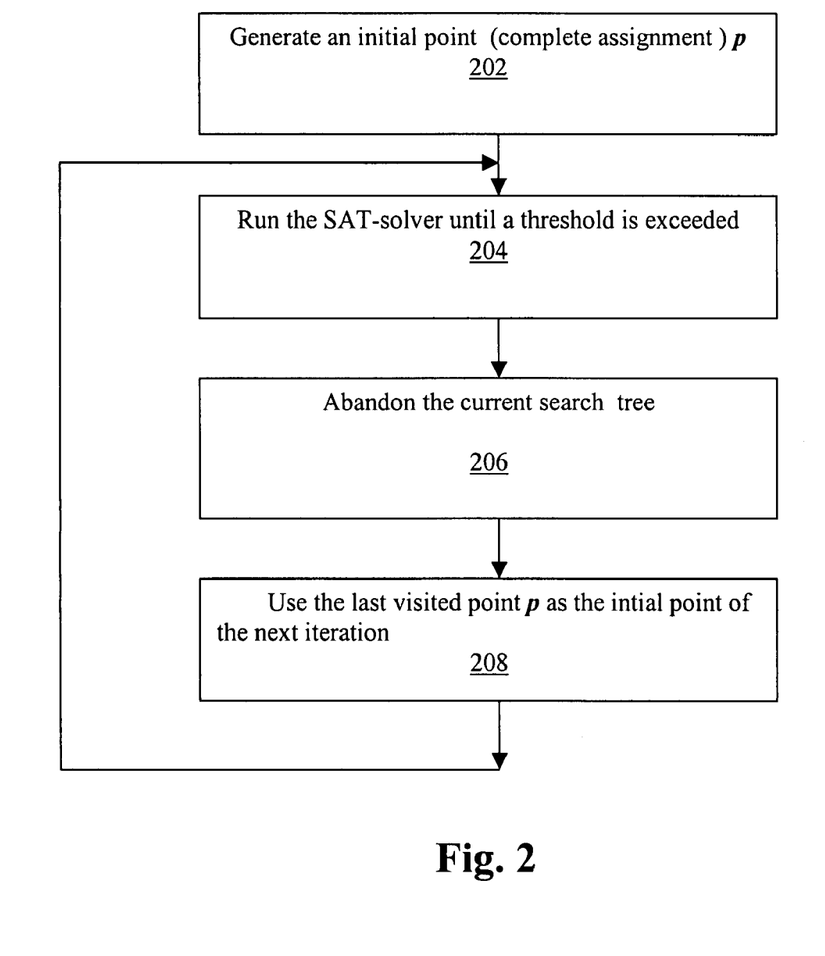
FIG. 2 shows a flowchart the new SAT-solver with restarts according to some embodiments of the invention.

FIG. 2 is a process flow of some embodiments of the inventive SAT-solver with restarts. At 202, a an initial point p is generated. At line 204, an embodiment of the SAT-solver without restarts is run, e.g., the Sat-solver described with respect to FIG. 1 in lines 104-128. Then if some threshold value is exceeded, the current search is tree abandoned at 206. In some embodiments, this threshold may correspond to a certain number T of conflicts. Once the number of conflicts that has occurred since the last restart exceeds T, the SAT-solver makes a restart. The SAT-solver starts a new iteration at 208 using the last point reached in the previous iteration as the initial point.

Decision-Making

The decision-making of the inventive SAT-solver according to some embodiments is to fix an assignment of the current point, e.g., as shown in line 124 of FIG. 1. The SAT-solver can either fix an existing assignment to a variable x in the current point p, or can first change the value of x in p and then fix this value.

In one embodiment of the invention, the SAT-solver makes assignments only to variables of clauses currently falsified by the current point p. In some embodiments, the present SAT-solver can use heuristics to choose the assignment to fix.

Figure 4:
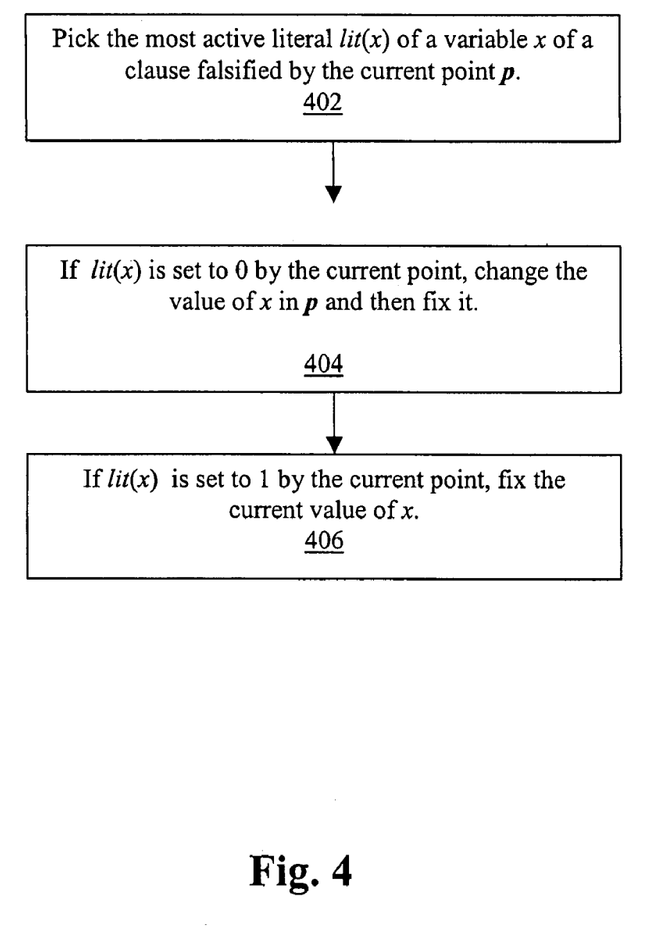
FIG. 4 shows a flowchart of a decision making heuristic according to some embodiments of the invention.

FIG. 4 is a flowchart of a decision-making process for choosing the assignment to fix. At 402, the decision-making process selects the next variable to fix among the unfixed variables of clauses of M(p). In some embodiments, the process selects the variable whose literal activity (of either polarity) has the highest activity value. The activity of literals is computed similar to BerkMin. In one embodiment, every time a clause C is involved in a conflict, the activity of every literal of C is incremented by one.

Then, assignment setting the most active literal of a candidate variable to 1 by the process is fixed. Suppose lit(x) of a variable x is the most active among variables of clauses of M(p). If lit(x) is set to 0 by the assignment to x in the current point p, then the point p is changed (by flipping the value of x) and then the value of x is fixed at 404. If lit(x) is set to 1 by the assignment to x in the current point p, then p does not change and the current assignment to x is fixed at 406.

ADVANTAGES a) Identifying Small Unsatisfiable Subformulas

Suppose that a large formula F to be tested for satisfiability has a small unsatisfiable subformula G. Then any complete assignment p falsifies a clause of G, and so the set of falsified clauses M(p) contains a clause of G. Since the present SAT-solver makes assignments to variables of clauses of M(p), variables of G will be always among candidates for decision-making.

In contrast, for a conventional SAT-solver that uses partial assignments, there are branches on variables involved in recent conflicts. Since the subformula G is small, there is a great probability such a SAT-solver will have conflicts relating variables of the formula F\G (consisting of the clauses of F that are not in G). Hence, it is quite possible, and even likely, that conventional SAT-solver will get trapped in the subformula F\G.

In some embodiments, after every given number of decisions, the new SAT-solver will try to pick a clause of M(p) whose conflict activity is the smallest. For example, such a clause of M(p) can be picked every one hundred decisions. This means that the new SAT-solver will always touch different parts of the formula. This cannot be done by a SAT-solver operating on partial assignments, since a partial assignment does not provide information about the parts of the formula that need to be touched next.

b) Finding Clauses that can be Resolved

Assume that a clause $C_1$ is falsified by the current complete assignment $p_1$ and a clause $C_2$ is falsified by the complete assignment p obtained from $p_1$ by flipping a variable. Then, if clauses $C_1$ and $C_2$ have literals of a variable x, they can be resolved in x. Thus, the inventive SAT-solver "better" takes into account the "resolution nature" of the underlying proof system.

Figure 3:
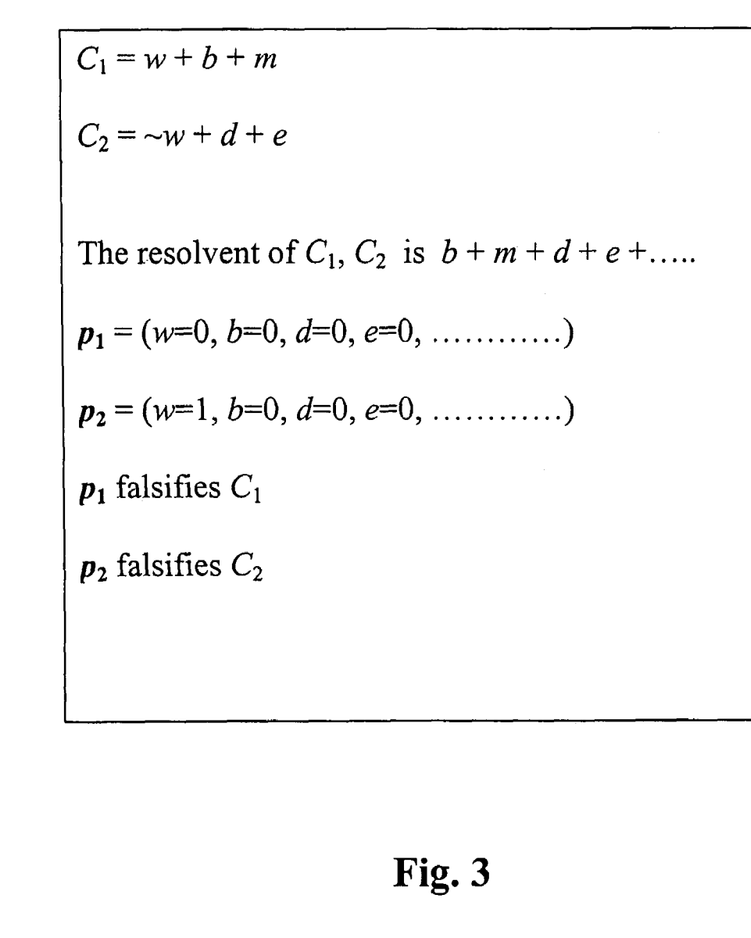
FIG. 3 illustrates a resolution operation.

To illustrate, consider the data presented in FIG. 3 that represents a portion of a hypothetical formula describing some part of an IC design and/or design process. Two clauses $C_1$=w+b+m and $C_2$=~w+d+e are shown. These two clauses have opposite literals of the variable w and so can be resolved. Their resolvent C is shown in FIG. 3. Suppose that the current point of the SAT-solver is $p_1$ shown in FIG. 3. Then, the set of falsified clauses $M(p_1)$ contains clause $C_1$. Suppose that the SAT-solver flips the value of w producing the point $p_2$ shown in FIG. 3. In this case, $M(p_2)$ contains clause $C_2$.

c) Efficient Decision-Making

One advantage of the current approach is that it can be very intelligent and local about the manner in which the Boolean formula is handled. Given the size and complexity of modern IC designs, it is likely that the formula addressed by a SAT-solver may be very large, e.g., if the entirety of a complex circuit is converted into the formula. Such a large and complex design may correspond to a Boolean formula/equation having literally millions of variables. Picking next variable for "branching" may be very time consuming. In the presently described SAT-solver, only variables of the set M(p) are considered as candidates for decision-making. The size of M(p) is dramatically smaller than the entire set of clauses of the original formula. This makes the decision-making of the new SAT-solver very efficient since it is done in a very local and precise manner.

d) Frequent Restarts

In some embodiments, the new SAT-solver may make restarts, e.g., as described with respect to FIG. 2. When a new iteration starts, the new SAT-solver may use the last point reached in the previous iteration as the initial point of the new iteration. This makes proofs obtained by the SAT-solver more coherent. In addition, restarts can be performed by the new SAT-solver more frequently.

System Architecture Overview

Figure 5:
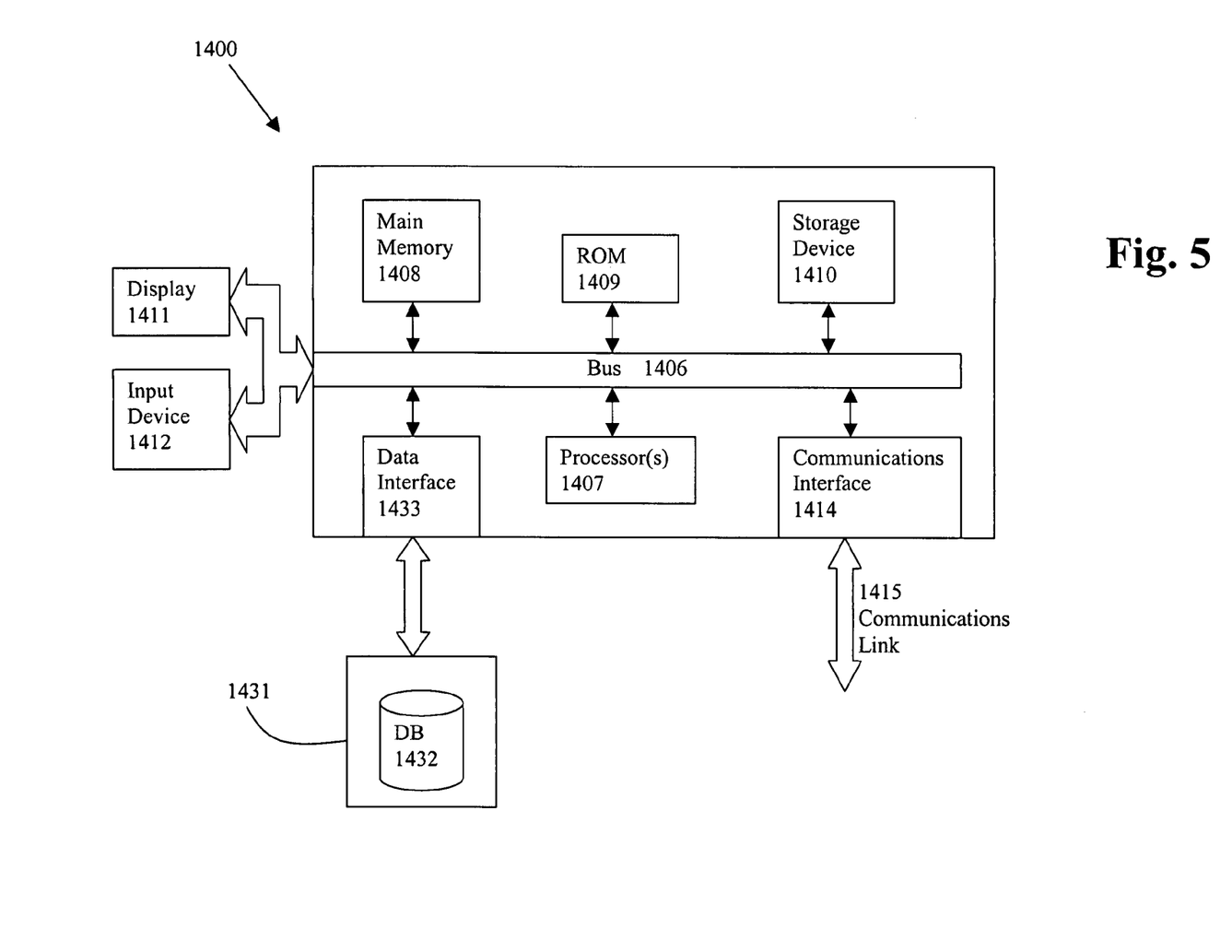
FIG. 5 illustrates an example computing architecture with which embodiments of the invention may be practiced.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A method for implementing an integrated circuit design, comprising:

identifying an integrated circuit design to operate upon with an electronic design automation tool, the electronic design automation tool comprising a SAT-solver mechanism;

converting the integrated circuit design into a formula for which Boolean satisfiability is addressed by the SAT-solver mechanism;

solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment; and generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable.

2. The method of claim 1 in which a variable x of a current complete assignment is fixed.

3. The method of claim 2 further comprising visiting points after fixing x, in which all points visited after fixing x have the same value of x, until x is unfixed.

4. The method of claim 2 in which a next variable to be fixed is chosen among variables of the clauses falsified by the current complete assignment.

5. The method of claim 1 in which the Boolean constraint propagation (BCP) procedure is invoked if there is a clause C of the current formula such that all literals of (but one are set to 0 by fixed assignments and a variable x of C is not fixed yet.

6. The method of claim 5 in which the BCP procedure fixes x at a value satisfying the clause C.

7. The method of claim 5 in which a current point p changes its value in variable x if the BCP procedure fixes x at the value that disagrees with the value of x corresponding to p.

8. The method of claim 2 in which a conflict occurs if all literals of a clause of a current formula are set to 0 by fixed assignments.

9. The method of claim 8 in which a conflict clause is generated and added to the current formula.

10. The method of claim 2 in which the choice of the variable to fix is based on activity of literals of variables.

11. The method of claim 10 in which the activity of the literals and/or the variable is computed based on the presence of the literals and/or the variables in clauses involved in conflicts.

12. The method of claim 2 in which an active literal lit(x) of the variable x chosen among clauses falsified by the current assignment is set to 1 and the assignment to x setting lit(x) to 1 is fixed.

13. The method of claim 12 in which a current point p does not change if its assignment to x sets lit(x) to 1.

14. The method of claim 12 which a current point p changes its value in the variable x, if its current assignment to x sets lit(x) to 0.

15. The method of claim 1 which is performing synthesis, automatic test pattern generation (ATPG), verification, or simulation for the integrated circuit design.

16. The method of claim 1 in which the SAT-solver performs one or more restarts.

17. The method of claim 16 in which a new iteration based upon the one or more restarts uses a last point reached in a previous iteration as an initial point.

18. The method of claim 16 in which a restart is performed if a threshold value is exceeded.

19. The method of claim 18 in which the threshold value corresponds to a number of conflicts.

20. The method of claim 1 in which the SAT-solver does not perform a restart.

21. The method of claim 1 in which decision making is local.

22. A method for operating a SAT-solver, comprising:
receiving a formula for which Boolean satisfiability is to be addressed;
solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment;
generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable; and
storing results of solving the Boolean satisfiability in a computer readable medium.

23. The method of claim 22 in which a variable x of a current complete assignment is fixed.

24. The method of claim 23 further comprising visiting points after fixing x, in which all points visited after fixing x have the same value of x, until x is unfixed.

25. The method of claim 23 in which a next variable to be fixed is chosen among variables of the clauses falsified by the current complete assignment.

26. The method of claim 23 in which a conflict occurs if all literals of a clause of a current formula are set to 0 by fixed assignments.

27. The method of claim 26 in which a conflict clause is generated and added to the current formula.

28. The method of claim 23 in which the choice of the variable to fix is based on activity of literals of variables.

29. The method of claim 23 in which an active literal lit(x) of the variable x chosen among clauses falsified by the current assignment is set to 1 and the assignment to x setting lit(x) to 1 is fixed.

30. The method of claim 22 in which the electronic design automation tool is performing synthesis, automatic test pattern generation (ATPG), verification, or simulation for the integrated circuit design.

31. The method of claim 22 in which the SAT-solver performs one or more restarts.

32. The method of claim 31 in which a new iteration based upon the one or more restarts uses a last point reached in a previous iteration as an initial point.

33. The method of claim 31 in which a restart is performed if a threshold value is exceeded.

34. The method of claim 22 in which the SAT-solver does not perform a restart.

35. A system for implementing an integrated circuit design, comprising:
means for identifying an integrated circuit design to operate upon with an electronic design automation tool, the electronic design automation tool comprising a SAT-solver mechanism;
means for converting the integrated circuit design into a formula for which Boolean satisfiability is addressed by the SAT-solver mechanism;
means for solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment; and
means for generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable.

36. The system of claim 35 in which a variable x of a current complete assignment is fixed.

37. The system of claim 35 in which the system is performing synthesis, automatic test pattern generation (ATPG), verification, or simulation for the integrated circuit design.

38. The system of claim 35 in which a system local search is performed.

39. A computer program product that includes a computer readable medium, the computer readable medium comprising a plurality of computer instructions which, when executed by a processor, cause the processor to execute performing a method for implementing an integrated circuit design, the process comprising:

identifying an integrated circuit design to operate upon with an electronic design automation tool, the electronic design automation tool comprising a SAT-solver mechanism;

converting the integrated circuit design into a formula for which Boolean satisfiability is addressed by the SAT-solver mechanism;

solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment; and generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable.

40. The computer program product of claim 39 in which a variable x of a current complete assignment is fixed.

41. The computer program product of claim 39 in which the electronic design automation tool is performing synthesis, automatic test pattern generation (ATPG), verification, or simulation for the integrated circuit design.

42. The computer program product of claim 39 in which a system local search is performed.

43. A system for operating a SAT-solver, comprising:

means for receiving a formula for which Boolean satisfiability is to be addressed; and means for solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment; and means for generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable.

44. The system of claim 43 in which a variable x of a current complete assignment is fixed.

45. The system of claim 43 in which the system is performing synthesis, automatic test pattern generation (ATPG), verification, or simulation for the integrated circuit design.

46. The system of claim 43 in which a system local search is performed.

47. A computer program product that includes a computer readable medium, the computer readable medium comprising a plurality of computer instructions which, when executed by a processor, cause the processor to execute performing a method for operating a SAT-solver, the process comprising:

receiving a formula for which Boolean satisfiability is to be addressed;

solving the Boolean satisfiability using complete assignments, wherein Boolean constraint propagation is performed to solve the Boolean satisfiability, the Boolean constraint propagation fixing variables and making a decision assignment fixing a variable at a value satisfying an active literal, where literal activity is computed based on conflict clauses and the variable to be assigned is chosen from clauses falsified by the current complete assignment; and generating a conflict clause for the formula if a conflict occurs, wherein a determination is made whether the conflict clause is empty or not empty, and where upon determining that the conflict clause is not empty returning to an earlier fixed variable and unfixing the earlier fixed variable as well as unfixing assignments made after the earlier fixed variable.

48. The computer program product of claim 47 in which a variable x of a current complete assignment is fixed.

49. The computer program product of claim 47 in which the process is performing synthesis, automatic test pattern generation (ATPG), verification, or simulation for the integrated circuit design.

50. The computer program product of claim 47 in which a system local search is performed.

* * * * *